(12) United States Patent
Kim

(10) Patent No.: US 11,845,498 B2
(45) Date of Patent: Dec. 19, 2023

(54) CONTROL METHODS FOR REAR WHEEL STEERING APPARATUS OF CARS

(71) Applicants: HYUNDAI MOTOR COMPANY, Seoul (KR); KIA MOTORS CORPORATION, Seoul (KR)

(72) Inventor: Jong-Min Kim, Gwangmyeong-si (KR)

(73) Assignees: HYUNDAI MOTOR COMPANY, Seoul (KR); KIA MOTORS CORPORATION, Seoul (KR)

( * ) Notice: Subject to any disclaimer, the term of this patent is extended or adjusted under 35 U.S.C. 154(b) by 104 days.

(21) Appl. No.: 16/798,810

(22) Filed: Feb. 24, 2020

(65) Prior Publication Data

US 2021/0053609 A1 Feb. 25, 2021

(30) Foreign Application Priority Data

Aug. 22, 2019 (KR) .................. 10-2019-0103159

(51) Int. Cl.
*B62D 5/04* (2006.01)
*B60N 2/00* (2006.01)
*G01R 19/165* (2006.01)

(52) U.S. Cl.
CPC ............ *B62D 5/046* (2013.01); *B60N 2/002* (2013.01); *G01R 19/165* (2013.01)

(58) Field of Classification Search
CPC .. G01R 19/165; B62D 7/1581; B62D 5/0481; B62D 5/0463; B62D 6/002; B62D 6/08; B62D 5/04; B62D 5/046; B62D 7/1554; B60W 10/20; B60W 30/045; B60W 30/02; B60Y 2400/301; B60Y 2400/304; B60Y 2400/84; B60N 2/002
See application file for complete search history.

(56) References Cited

U.S. PATENT DOCUMENTS

| | | | | |
|---|---|---|---|---|
| 5,810,108 | A * | 9/1998 | Jung ................ | B62D 7/148 180/404 |
| 2001/0002631 | A1* | 6/2001 | Okanoue ............ | B62D 5/0463 180/443 |
| 2008/0306655 | A1* | 12/2008 | Ukai ................. | B62D 5/0463 701/41 |

(Continued)

FOREIGN PATENT DOCUMENTS

| JP | 2017043114 A | * | 3/2017 |
|---|---|---|---|
| JP | 2017210080 A | * | 11/2017 |

(Continued)

OTHER PUBLICATIONS

KR101612670B1_Description_20220121_1425.pdf (Year: 2016).*

(Continued)

*Primary Examiner* — Thomas Ingram
*Assistant Examiner* — Faris Asim Shaikh
(74) *Attorney, Agent, or Firm* — LEMPIA SUMMERFIELD KATZ LLC

(57) ABSTRACT

A control method for a rear wheel steering apparatus of a vehicle adjusts current applied to a rear wheel steering (RWS) actuator by determining a compensation current value based on the aging of devices installed in the RWS actuator installed in the rear wheel steering apparatus, and further adjusts the current applied to the RWS actuator with a compensation current value based on the friction of the devices installed in the RWS actuator.

5 Claims, 3 Drawing Sheets

(56) References Cited

U.S. PATENT DOCUMENTS

| | | | | |
|---|---|---|---|---|
| 2011/0035108 A1* | 2/2011 | Yamashita | ............ | B62D 5/0481 |
| | | | | 701/41 |
| 2020/0307675 A1* | 10/2020 | Yamashita | ............. | B62D 5/046 |
| 2020/0339185 A1* | 10/2020 | Farrelly | ............. | B62D 15/0215 |

FOREIGN PATENT DOCUMENTS

| | | | |
|---|---|---|---|
| KR | 101612670 B1 * | 4/2016 | |
| KR | 101612670 B1 * | 4/2016 | |
| KR | 10-2018-0068747 A | 6/2018 | |
| KR | 10-2019-0062716 A | 6/2019 | |

OTHER PUBLICATIONS

Translation of JP-2017210080-A retrieved from PE2E Search on Dec. 7, 2022 (Year: 2022).*

Translation of JP-2017043114-A retrieved from Espacenet on Dec. 7, 2022 (Year: 2022).*

Translation of KR 101612670 B1 retrieved from Espacenet on Jan. 25, 2022 (Year: 2022).*

* cited by examiner

CONTROL METHODS FOR REAR WHEEL STEERING APPARATUS OF CARS

CROSS-REFERENCE TO RELATED APPLICATION

This application claims priority to and the benefit of Korean Patent Application No. 10-2019-0103159, filed on Aug. 22, 2019, the entire contents of which are incorporated herein by reference.

FIELD

The present disclosure relates to a control method for a rear wheel steering apparatus of a vehicle.

BACKGROUND

The statements in this section merely provide background information related to the present disclosure and may not constitute prior art.

Generally, components of a device that constitutes a rear wheel steering (RWS) apparatus of a vehicle have a low mechanical efficiency.

That is, the efficiency of the components constituting the rear wheel steering apparatus is lower than that of components constituting Rack type-MDPS (R-MDPS). We have discovered that the reason is because the rear wheel steering apparatus is designed for sticky operation to prevent a reverse input from a lateral force.

We have also found that since actuators of devices constituting the rear wheel steering apparatus having low efficiency are driven at a high torque, a mechanical frictional force is reduced according to the aging of the vehicle and the reaction speed of each actuator is changed, so that it is difficult to manage the distribution of friction and thereby manage the target performance of the vehicle.

SUMMARY

The present disclosure provides a control method for a rear wheel steering apparatus of a vehicle and capable of improving a phenomenon in which a mechanical frictional force is reduced according to the aging of the vehicle and thus a reaction speed of the actuator is changed.

In an aspect of the present disclosure, a control method for a rear wheel steering apparatus of a vehicle includes: determining, by a controller, a first compensation current value based on aging of devices installed in a rear wheel steering (RWS) actuator installed in the rear wheel steering apparatus; adjusting, by the controller, a current applied to the RWS actuator based on the first compensation current value; determining, by the controller, a second compensation current value based on a mechanical friction of the devices installed in the RWS actuator; and adjusting, by the controller, the current applied to the RWS actuator based on the second compensation current value.

Further areas of applicability will become apparent from the description provided herein. It should be understood that the description and specific examples are intended for purposes of illustration only and are not intended to limit the scope of the present disclosure.

DRAWINGS

In order that the disclosure may be well understood, there will now be described various forms thereof, given by way of example, reference being made to the accompanying drawings, in which.

Figure 1:
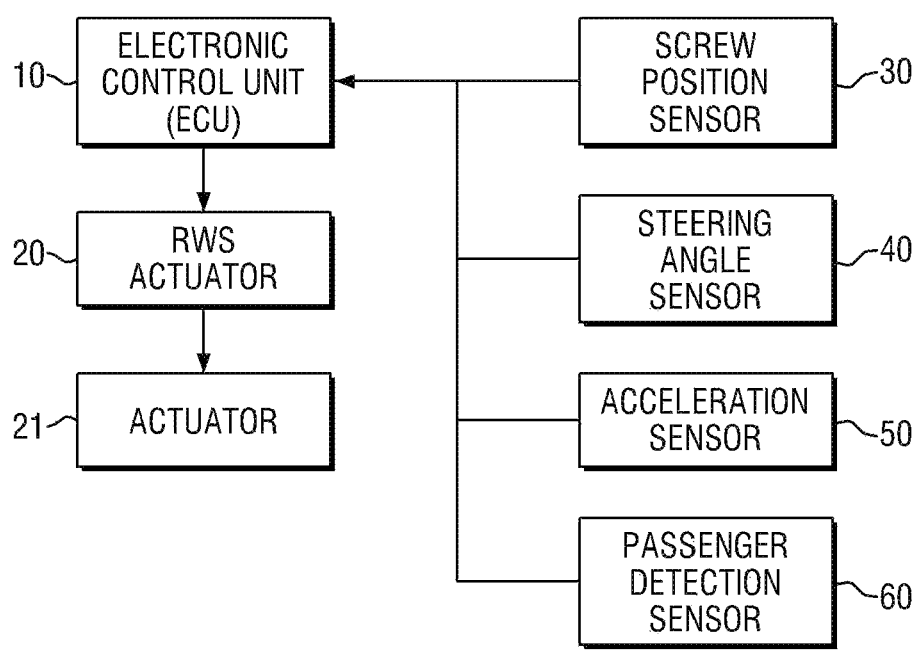
FIG. 1 is a diagram of a system for performing a control method for a rear wheel steering apparatus of a vehicle according to one form of the present disclosure.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

Hereinafter, a control method for a rear wheel steering apparatus of a vehicle according to exemplary forms of the present disclosure will be described with reference to the drawings.

However, the disclosed drawings are provided as examples to fully convey the spirit of the present disclosure to those skilled in the art. Thus, the present disclosure may be embodied in other aspects without being limited to the accompanying drawings.

Furthermore, unless otherwise defined in the terms used in the specification, those having ordinary skill in the art to which the present disclosure belongs have the common meaning. The detailed description of known functions and configurations that make the gist of the present disclosure obscure will be omitted in the following description and the accompanying drawings.

FIG. 1 is a diagram of a system for performing a control method for a rear wheel steering apparatus of a vehicle according to one form of the present disclosure.

Referring to FIG. 1, the control method for the rear wheel steering apparatus is performed in the system including an electronic control unit (ECU) 10 that is installed in the vehicle to perform an electronic control operation of the vehicle, an RWS actuator 20 that is controlled by the electronic control unit 10 to operate a rear wheel tow of the rear wheel steering apparatus, a screw position sensor 30 that measures a stroke position of the rear wheel tow accommodated in the RWS actuator 20 to transmit it to the electronic control unit 10, a steering angle sensor 40 that is installed in the vehicle to sense the steering direction of the vehicle and thereby transmit it to the electronic control unit 10, an acceleration sensor 50 that is installed in the vehicle to sense the acceleration of the vehicle and thereby transmit it to the electronic control unit 10, and a passenger detection senor 60 that senses whether a passenger sits in a seat installed in the vehicle and transmits the sensed result to the electronic control unit 10.

An actuator 21 is installed in the RWS actuator 20 to operate the rear wheel tow. This controls current applied to the actuator 21 to adjust the maximum torque of the actuator 21, and adjusts a maximum operating speed of the RWS actuator 20 according to the torque amount of the actuator 21.

The acceleration sensor 50 includes a lateral acceleration sensor that senses the lateral acceleration of the vehicle, and a longitudinal acceleration sensor that senses the longitudinal acceleration of the vehicle.

Furthermore, in one form, the passenger detection senor 60 is a load sensor installed at the seat.

In another form, the RWS actuator 20 is either of a left and right integrated actuator which collectively controls a left wheel and a right wheel of the rear wheel, and a left and right independent actuator which independently controls the left wheel and the right wheel of the rear wheel.

Hereinafter, the control method for the rear wheel steering apparatus of the present disclosure performed in the system configured as such will be described.

The control method for the rear wheel steering apparatus adjusts current applied to the RWS actuator 20 by determining a compensation current value according to the aging of devices installed in the RWS actuator 20 installed in the rear wheel steering apparatus, and moreover adjusts current applied to the RWS actuator 20 by determining the compensation current value according to the friction of the devices installed in the RWS actuator 20.

Figure 2:
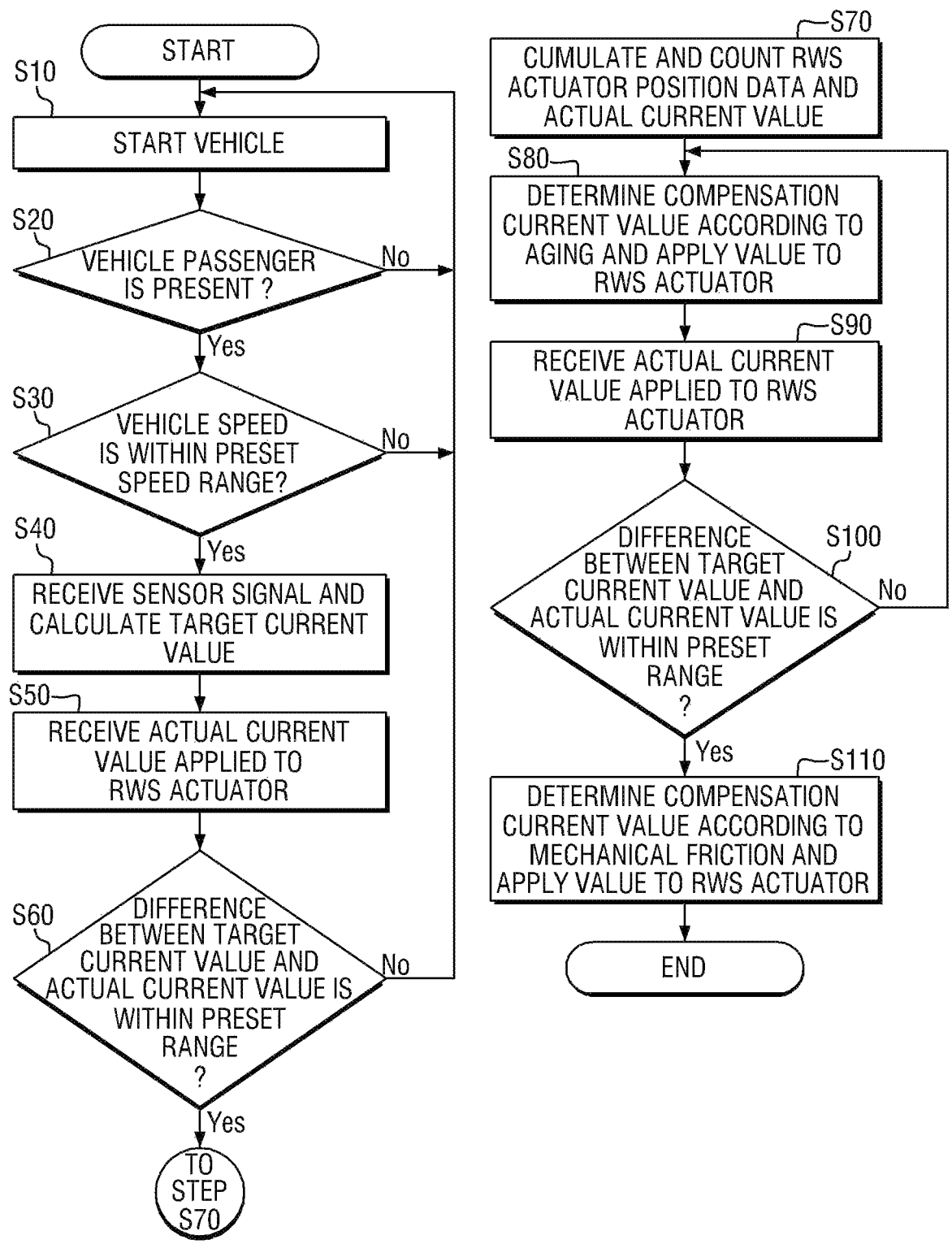
FIG. 2 is a flowchart illustrating the control method for the rear wheel steering apparatus of the vehicle according to one form of the present disclosure.

FIG. 2 is a flowchart illustrating the control method for the rear wheel steering apparatus of the vehicle according to one form of the present disclosure.

Referring to the drawing, the control method for the rear wheel steering apparatus determines whether there is a passenger in the vehicle at step S20, in response to a signal sensed from the passenger detection senor and received by the electronic control device 10, if the vehicle is started at step S10.

When it is determined that there is the passenger in the vehicle, the electronic control unit 10 determines whether the vehicle speed is within a preset speed range at step S30.

In order to determine whether the vehicle speed is within the preset speed range, the RPM value of the RPM sensor installed in the vehicle may be referred.

When it is determined that the vehicle speed is within the preset speed range, the electronic control unit 10 receives signals sensed from the sensors installed in the vehicle, and calculates target current applied to the actuator 21 accommodated in the RWS actuator 20, based on received sensor signal data of the vehicle at step S40.

In one form, the target current value is determined in the manner of selecting a target current value It corresponding to the corresponding sensor data from a table, by referring the table where the target current value is mapped according to the sensor data that is set by the electronic control unit 10.

In this regard, the sensor installed in the vehicle includes the steering angle sensor 40, the acceleration sensor 50, and the screw position sensor 30. The sensor signal data transmitted from these sensors includes the steering angle of the vehicle, the acceleration and the position data of the actuator 21.

Therefore, the calculation of the target current is performed in the manner of selecting the target current value It corresponding to the corresponding steering angle, the acceleration and the position of the actuator 21 from the table, by referring the table where the target current value is mapped according to the steering angle, the acceleration and the actuator position which are set by the electronic control unit 10.

Next, the electronic control unit 10 receives an actual current value applied to the RWS actuator 20 at step S50, and determines at step S60 whether a difference between the target current value applied to the RWS actuator calculated at step S40 and the received actual current value Ia exceeds a preset current difference value Id at step S60.

For example, assuming that the target current value It is 10 A, the actual current value Ia is 16 A, and the preset current difference value Id is 5 A, a difference between the target current value It and the actual current value Ia is equal to 6 A and exceeds 5 A of the preset current difference value Id. Hence, the compensation control protocol according to the aging that is the compensation control protocol of the present disclosure that will be described below is performed.

In the compensation control protocol according to the aging, the electronic control unit 10 continuously cumulates and counts the actuator position data value received from the screw position sensor 30 and the actual current value Ia applied to the actuator at step S70, and determines the compensation current value Ic according to the aging of the rear wheel steering apparatus on the basis of the cumulative value of the counted actuator position data and the cumulative value of the actual current value Ia and then applies the determined value to the RWS actuator at step S80.

In one form, the compensation current value Ic may be determined in the manner of selecting the compensation current value Ic corresponding to the cumulative value of the corresponding actuator position data and the cumulative value of the actual current value from a table, by referring the table where the cumulative value of the actuator position data set by the electronic control unit 10 and the cumulative value of the actual current value are mapped.

For example, assuming that the actual current value is 5000 A in the state where the cumulative count of the cumulative value of the actuator position data is equal to 500, the electronic control unit 10 selects the compensation current value Ic from the table to be +0.2 A, and applies current obtained by adding 0.2 A to the currently applied current value to the RWS actuator.

Further, the electronic control unit 10 receives the actual current value applied to the RWS actuator 20 at step S90, and determines whether a difference between the target current value applied to the RWS actuator and calculated at step S90 and the received actual current value Ia exceeds the preset current difference value Id at step S100.

For example, as described above, assuming that the target current value It is 10 A, the actual current value Ia is 16 A, and the preset current difference value Id is 5 A, a difference between the target current value It and the actual current value Ia is equal to 6 A and exceeds 5 A of the preset current difference value Id. Hence, the compensation protocol according to the mechanical friction that is another compensation control protocol of the present disclosure is performed.

That is, in the compensation control protocol according to the mechanical friction, the electronic control unit 10 determines the compensation current value If according to the mechanical friction and applies the determined value to the RWS actuator at step S110. In one form, the compensation current value Ic according to the mechanical friction is determined in the manner of selecting the compensation current value If corresponding to the frictional value from the table, by referring the table where the compensation current value ranging from an upper limit to a lower limit of the frictional value that is set by the electronic control unit 10 is mapped. For example, the compensation current value If is set from −0.5 A to +0.5 A according to the range from the upper limit to the lower limit of the frictional value, and the compensation current value If that is within this range is applied to the RWS actuator 20.

Figure 3:
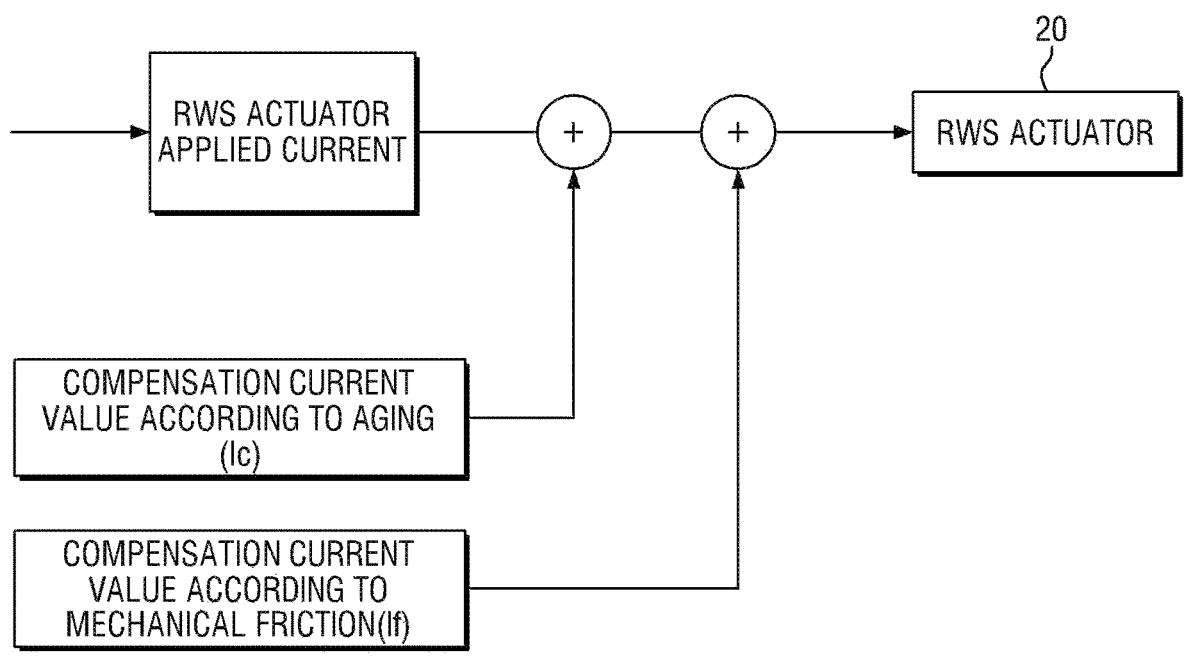
FIG. 3 is a signal flowchart illustrating the control method for the rear wheel steering apparatus of the vehicle according to one form of the present disclosure.

Therefore, as illustrated in FIG. 3, the actuator 21 is controlled by adding the compensation current value Ic according to the aging and the compensation current value If according to the mechanical friction to the current applied to the RWS actuator 20 of the rear wheel steering apparatus and then applying the added value to the RWS actuator 20.

In another form, in the same driving state, a component having high mechanical friction increases the amount of current applied to the actuator 21 depending on the desired torque, and a component having low mechanical friction reduces the amount of current applied to the actuator 21.

Therefore, according to the control method of the rear wheel steering apparatus, if the compensation current value Ic according to the aging and the compensation current value If according to the mechanical friction are determined and applied to the RWS actuator 20, the maximum current applied to the actuator 21 installed in the RWS actuator 20 is adjusted and the maximum torque of the motor is adjusted. Therefore, the maximum operating speed of the rear wheel steering apparatus can be increased and reduced, thus making it easy to manage the distribution of the friction of the devices constituting the rear wheel steering apparatus having low mechanical efficiency and to manage the target performance.

Meanwhile, the control method for the rear wheel steering apparatus is applied to both the left and right integrated RWS actuator which collectively controls the left wheel and the right wheel of the rear wheel, and the left and right independent actuator which independently controls the left wheel and the right wheel of the rear wheel.

The control method for the rear wheel steering apparatus of the vehicle according to the present disclosure performs compensation control of the components constituting the rear wheel steering apparatus, thus making it easy to manage the distribution of the friction of the devices, and preventing the performance deterioration of the actuator, such as a phenomenon where the reaction speed is reduced according to the aging of the vehicle, and consequently making it easy to manage the target performance of the rear wheel steering apparatus.

What is claimed is:

1. A control method for a rear wheel steering apparatus of a vehicle, the control method comprising:
    determining, by a controller, a first compensation current value based on aging of devices installed in a rear wheel steering (RWS) actuator installed in the rear wheel steering apparatus in response to a passenger detection performed by a passenger detection sensor and a vehicle speed determination performed by a revolutions per minute (RPM) sensor;
    adjusting, by the controller, a current applied to the RWS actuator based on the first compensation current value;
    determining, by the controller, a second compensation current value based on a mechanical friction of the devices installed in the RWS actuator; and
    adjusting, by the controller, the current applied to the RWS actuator based on the second compensation current value;
    wherein determining the first compensation current value based on aging of the devices comprises:
        when the vehicle starts, determining whether a passenger is present in the vehicle based on a signal sensed from the passenger detection sensor;
        when the passenger is present in the vehicle, determining whether a speed of the vehicle is within a preset speed range based on a signal sensed from the RPM sensor;
        when the speed of the vehicle is within the preset speed range, calculating a target current applied to the RWS actuator, by selecting, from a table, a target current value corresponding to received sensor data of the vehicle, wherein the table maps a plurality of target current values to sensor data set by the controller;
        receiving an actual current value applied to the RWS actuator, and determining whether a difference between the target current value applied to the RWS actuator and the received actual current value exceeds a preset current difference value;
        continuously cumulating and counting actuator position data received from a position sensor and the actual current value applied to the RWS actuator; and
        determining the first compensation current value based on a cumulative value of the counted actuator position data and a cumulative value of the actual current value;
    wherein determining the second compensation current value based on the mechanical friction comprises:
        receiving the actual current value applied to the RWS actuator;
        determining whether a difference between the target current value applied to the RWS actuator and the received actual current value exceeds a preset current difference value; and
        determining the second compensation current value based on the mechanical friction;
    wherein the actuator is controlled by adding the first compensation current value according to the aging and the second compensation current value according to the mechanical friction to the current applied to the RWS actuator of the rear wheel steering apparatus and then applying the added value to the RWS actuator.

2. The control method of claim 1, wherein calculating the target current includes: selecting the target current value from predetermined data based on sensor signal data.

3. The control method of claim 2, where in the sensor signal data comprises: a steering angle of the vehicle, acceleration and position data of the RWS actuator.

4. The control method of claim 1, where in determining the first compensation current value comprises:
    selecting the first compensation current value corresponding to the cumulative value of the corresponding actuator position data and the cumulative value of the actual current value from a predetermined table where the cumulative value of the actuator position data set by the controller and the cumulative value of the actual current value are mapped.

5. The control method of claim 1, where in determining the second compensation current value based on the mechanical friction includes:
    selecting the second compensation current value corresponding to a frictional value from a table where the second compensation current value ranging from an upper limit to a lower limit of the frictional value set by the controller is mapped.

* * * * *